(12) United States Patent
Schuegraf et al.

(10) Patent No.: US 8,580,615 B2
(45) Date of Patent: Nov. 12, 2013

(54) METHOD AND SYSTEM FOR WAFER LEVEL SINGULATION

(75) Inventors: Klaus Schuegraf, San Jose, CA (US); Seshadri Ramaswami, Saratoga, CA (US); Michael R. Rice, Pleasanton, CA (US); Mohsen S. Salek, Saratoga, CA (US); Claes H. Bjorkman, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/399,638

(22) Filed: Feb. 17, 2012

(65) Prior Publication Data

US 2013/0045570 A1 Feb. 21, 2013

Related U.S. Application Data

(60) Provisional application No. 61/444,618, filed on Feb. 18, 2011.

(51) Int. Cl.
*H01L 21/00* (2006.01)
*H01L 21/66* (2006.01)
*G01R 31/26* (2006.01)

(52) U.S. Cl.
USPC ........... 438/113; 438/118; 438/460; 438/462; 438/464; 438/15

(58) Field of Classification Search
USPC ............. 438/113, 458, 460, 464, 465, 12, 14, 438/15, 118
See application file for complete search history.

(56) References Cited

U.S. PATENT DOCUMENTS 3,811,182 A * 5/1974 Ryan et al. ............... 29/25.01
2003/0077878 A1 * 4/2003 Kumar et al. ............. 438/460
2004/0256504 A1 12/2004 Segrest et al.
2005/0064681 A1 * 3/2005 Wood et al. ............... 438/459
2006/0024924 A1 2/2006 Haji et al.
2006/0030130 A1 2/2006 Shao et al.
2007/0155129 A1 * 7/2007 Thallner ................... 438/455
2008/0008881 A1 1/2008 Yabuki et al.
2009/0218560 A1 * 9/2009 Flaim et al. ................. 257/9
2011/0308739 A1 * 12/2011 McCutcheon et al. .... 156/766

OTHER PUBLICATIONS

Notification Of Transmittal Of The International Search Report And The Written Opinion Of The International Searching Authority, Or The Declaration; International Search Report and Written Opinion Of The International Searching Authority for corresponding International Application No. PCT/US2012/025716 mailed on Dec. 18, 2012, 11 pages.

* cited by examiner

*Primary Examiner* — Mary Wilczewski
*Assistant Examiner* — Erik T Peterson
(74) *Attorney, Agent, or Firm* — Kilpatrick Townsend & Stockton LLP

(57) ABSTRACT

A method of singulating a plurality of semiconductor dies includes providing a carrier substrate and joining a semiconductor substrate to the carrier substrate. The semiconductor substrate includes a plurality of devices. The method also includes forming a mask layer on the semiconductor substrate, exposing a predetermined portion of the mask layer to light, and processing the predetermined portion of the mask layer to form a predetermined mask pattern on the semiconductor substrate. The method further includes forming the plurality of semiconductor dies, each of the plurality of semiconductor dies being associated with the predetermined mask pattern and including one or more of the plurality of devices and separating the plurality of semiconductor dies from the carrier substrate.

9 Claims, 8 Drawing Sheets

METHOD AND SYSTEM FOR WAFER LEVEL SINGULATION

CROSS-REFERENCES TO RELATED APPLICATIONS

This application claims priority to U.S. Provisional Patent Application No. 61/444,618, filed on Feb. 18, 2011, entitled "Method and System for Wafer Level Singulation," the disclosure of which is hereby incorporated by reference in its entirety for all purposes.

BACKGROUND OF THE INVENTION

The semiconductor industry has developed techniques for singulating semiconductor integrated circuit die. The die are then packaged for use in products. In a conventional process, the wafer is mounted on an adhesive tape and is then cut using a saw, for example, along scribe lines or saw streets between active die regions. The singulated die attached to the tape are then available for further packaging steps.

Despite the progress made in die singulation techniques, there is a need in the art for improved methods of wafer level singulation.

SUMMARY OF THE INVENTION

The present invention relates generally to semiconductor processing techniques. More particularly, the invention includes a method and apparatus for performing wafer level singulation. Merely by way of example, the invention has been applied to a method of laser singulating and debonding singulated semiconductor dies from a carrier wafer. The method and apparatus is applicable to a variety of semiconductor processing applications including wafer level packaging.

According to an embodiment of the present invention, a method of singulating a plurality of semiconductor dies is provided. The method includes providing a carrier substrate and joining a semiconductor substrate to the carrier substrate. The semiconductor substrate includes a plurality of devices. The method also includes forming a mask layer on the semiconductor substrate, exposing a predetermined portion of the mask layer to light, and processing the predetermined portion of the mask layer to form a predetermined mask pattern on the semiconductor substrate. The method further includes forming the plurality of semiconductor dies, each of the plurality of semiconductor dies being associated with the predetermined mask pattern and including one or more of the plurality of devices and separating the plurality of semiconductor dies from the carrier substrate.

According to another embodiment of the present invention, a system for singulation of semiconductor dies is provided. The system includes a coating unit operable to form a mask layer on a semiconductor substrate including a plurality of devices, a bonding unit operable to join the semiconductor substrate to a carrier substrate, and a laser processing unit operable to expose a predetermined portion of the mask layer to laser light. The system also includes a development processing unit operable to form a predetermined mask pattern on the semiconductor substrate and a singulation unit operable to form the plurality of semiconductor dies. Each of the plurality of semiconductor dies is associated with the predetermined mask pattern and includes one or more of the plurality of devices. The system further includes a die separation unit operable to separate the plurality of semiconductor dies from the carrier substrate.

According to a particular embodiment of the present invention, an alternative method of singulating a plurality of semiconductor dies is provided. The method includes forming an inert film coupled to a device surface of a semiconductor substrate, removing a portion of the inert film in a peripheral region, and forming an adhesive material coupled to the peripheral region of the device surface of the semiconductor substrate. The method also includes joining the semiconductor substrate to a carrier substrate and forming a plurality of semiconductor dies. The process for forming the plurality of semiconductor dies can include a masking process or be performed using a maskless process, both or either of which can utilize a laser singulation process. The method further includes separating the plurality of semiconductor dies from the carrier substrate.

Numerous benefits are achieved using the present invention over conventional techniques. For example, in an embodiment according to the present invention, methods and systems are provided for wafer level singulation, reducing packaging costs. In some embodiments, devices can be tested at wafer level, with only devices passing the testing being removed during processing. Depending upon the embodiment, one or more of these benefits may exist. These and other benefits have been described throughout the present specification and more particularly below. Various additional objects, features and advantages of the present invention can be more fully appreciated with reference to the detailed description and accompanying drawings that follow.

DETAILED DESCRIPTION OF SPECIFIC EMBODIMENTS

According to the present invention, semiconductor processing techniques are provided. More particularly, the invention includes a method and apparatus for performing wafer level singulation. Merely by way of example, the invention has been applied to a method of laser singulating and debonding singulated semiconductor dies from a carrier wafer. The method and apparatus is applicable to a variety of semiconductor processing applications including wafer level packaging.

According to an embodiment of the present invention, wafer bonding and debonding techniques are utilized. As described below, a carrier substrate, also referred to as a carrier wafer is provided. In some implementations, a silicon carrier substrate is utilized although other suitable substrates characterized by mechanical rigidity and ability to be processed at appropriate temperatures can be utilized. A semiconductor substrate, also referred to as a device wafer, is joined to the carrier substrate.

In some wafer bonding processes, an adhesive is applied to one or more surfaces of the carrier substrate and/or the semiconductor substrate as part of the bonding process. Heat treatment processes can also be performed. Thus, a temporary bond is formed during the wafer bonding process. Substrate thinning can be performed using a chemical mechanical polishing (CMP) process or other suitable process to reduce the thickness of the semiconductor substrate. After thinning, the semiconductor substrate is typically attached to a tape and the carrier substrate is removed a wafer debonding process, for example, shearing the substrate, inserting a wedge at the bond region, or the like. Once attached to the tape, the semiconductor substrate can be diced and then dies can be picked for placement during packaging.

The inventors have determined that the use of tape presents several undesirable processing constraints. As an example, the use of tape prevents some high temperature processing steps from being performed on the semiconductor substrate.

Figure 1A:
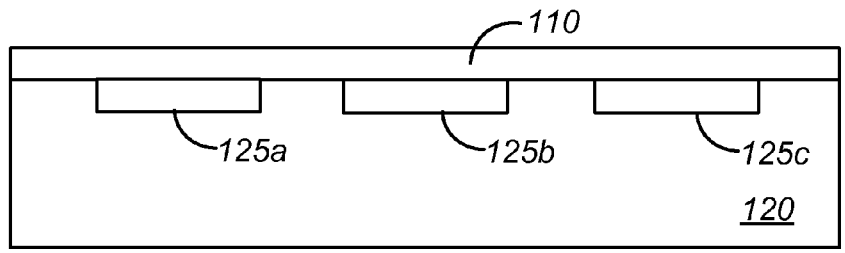
FIGS. 1A-1D are simplified schematic diagrams illustrating a first process flow according to an embodiment of the present invention.

FIGS. 1A-1D are simplified schematic diagrams illustrating a first process flow according to an embodiment of the present invention. Referring to FIG. 1A, an inert film 110 is formed on a device surface of semiconductor substrate 120. The inert film 110 can also be referred to as a mold material. Referring to FIG. 1A, the inert film 110 provides a film compatible with low temperature processing (e.g., less than 300° C., less than 275° C., less than 250° C., or the like) to protect the devices 125a, 125b, and 125c fabricated on the semiconductor substrate as well as the surfaces of the semiconductor substrate. The devices 125a, 125b, and 125c can be a wide variety of semiconductor devices including integrated circuits useful for fabricating processors, memory, and the like. The use of the term "inert" indicates that the film is substantially unreactive with respect to the devices formed on the semiconductor substrate. Embodiments of the present invention utilize inert films that are easy to remove from the semiconductor substrate as described more fully below.

A number of inert films are included within the scope of the present invention, including spin on films, spin on carbon films, photoresists, oxide films that are strippable using wet chemistry, solvent soluble films such as an Advanced Patterning Film (APF), which can be deposited by Plasma-Enhanced Chemical Vapor Deposition (PECVD) using an Applied Producer system. These APF films (e.g., APF, APFe, APFx, or the like) utilize a strippable (i.e., plasma ashable) amorphous carbon hard mask that is suitable for critical patterning steps. Combinations of materials can be utilized to form a composite inert structure having multiple layers of the various materials described herein. As an example, an adhesion layer can be applied on top of the inert film 110 or below the inert film 110, which, as mentioned above, can be multilayer composite structure. One of ordinary skill in the art would recognize many variations, modifications, and alternatives.

The compatibility of the inert film 110 with low temperature processing makes the embodiments described herein suitable for use with a wide variety of semiconductor substrates including active devices, since, for example, solder bumps present on the semiconductor substrate tend to reflow at temperatures in excess of 250° C. One of ordinary skill in the art would recognize many variations, modifications, and alternatives. Depending on the devices present on the semiconductor substrate, the definition of low temperature processing can vary depending on the particular device structures and features.

Figure 1B:
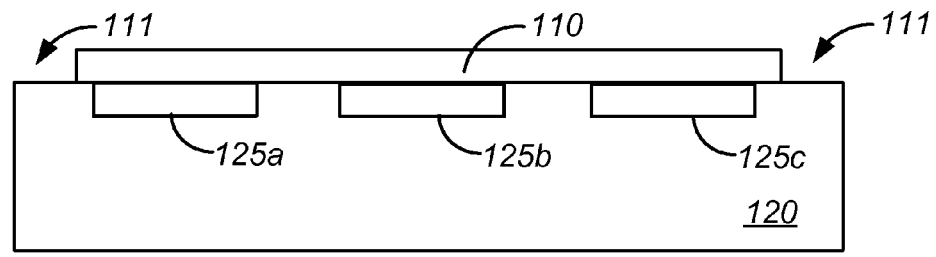

Referring to FIG. 1B, an edge removal process is performed to remove a peripheral portion of the inert film 110, providing peripheral regions 111 of the carrier substrate that are substantially free of the inert film 110. As an example, a processing unit including an edge bead removal (EBR) arm can be provided at a corner of the processing unit. In this example, the EBR arm rotates around a pivot located at a proximal end of the EBR arm to position a distal end of the EBR arm at a position over an edge of the semiconductor substrate mounted on a spin chuck. An EBR fluid is dispensed through a nozzle located at the distal end of the EBR arm to remove the peripheral portion of the inert film 110. Other suitable techniques for removing a peripheral portion of the inert film 110 are included within the scope of the present invention.

Figure 1C:
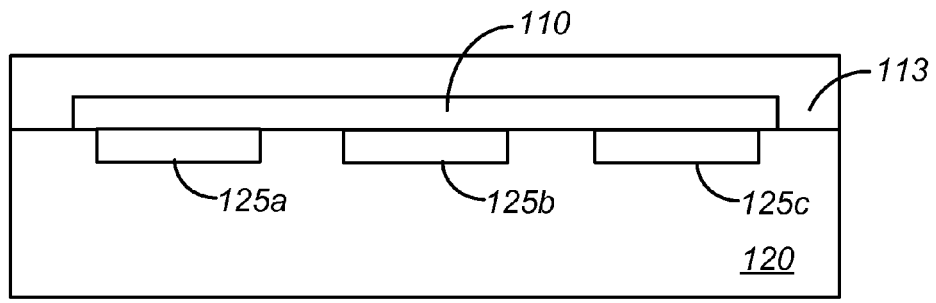
Figure 1D:
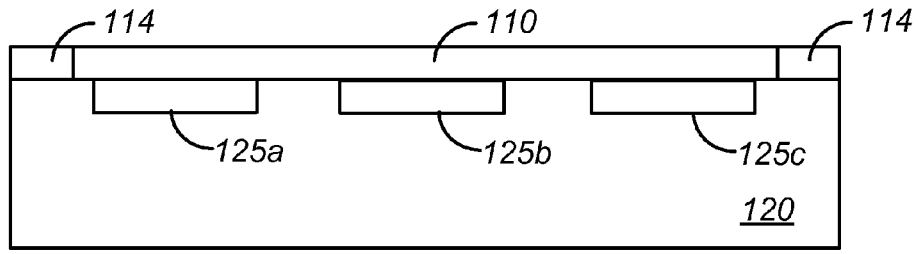

Referring to FIG. 1C, an adhesive material 113 is applied to the semiconductor substrate, covering the inert film 110 in the illustrated embodiment. The adhesive material is then planarized to form an annular ring 114 at the peripheral portions of the carrier substrate as illustrated in FIG. 1D. In additional to planarization, thinning of both the inert layer 110 and the annular ring 114 can be accomplished during these processing steps. As described below, the semiconductor substrate can be bonded to the carrier substrate for further processing, such as thinning Although a planar structure is illustrated in FIG. 1D, such a planar structure is not required by the present invention. In some embodiments, cavities extending toward the device surface (downward in FIG. 1D) can be formed in the inert film and/or the adhesive film.

In some embodiments, the inert film and/or the adhesive film are applied to the carrier substrate rather than the semiconductor substrate. One of ordinary skill in the art would recognize many variations, modifications, and alternatives.

In some embodiments, rather than using an annular ring of adhesive material, other predetermined portions of the semiconductor substrate are coated with the adhesive material. For example, on the edge of a wafer, it is typical to have partial die or dummy die due to the generally circular wafer shape and generally rectangular die shape. The inert material can be removed at the locations of these partial die or dummy die and adhesive material can be applied at these locations to provide a patchwork of adhesive locations distributed across the surface of the semiconductor substrate. As an example, dots of solvent can be applied followed by dots of adhesive. Alternatively, for processing incorporating electrical testing prior to wafer bonding, dies that are defective (i.e., non-yielding dies) can be identified and the adhesive can be applied to these die. Continuing with this example, the application of the adhesive to the non-yielding die can prevent these die from being picked at a later stage of processing, simplifying the picking process and providing downstream intelligence. Combinations of these techniques can also be utilized. One of ordinary skill in the art would recognize many variations, modifications, and alternatives.

Figure 2A:
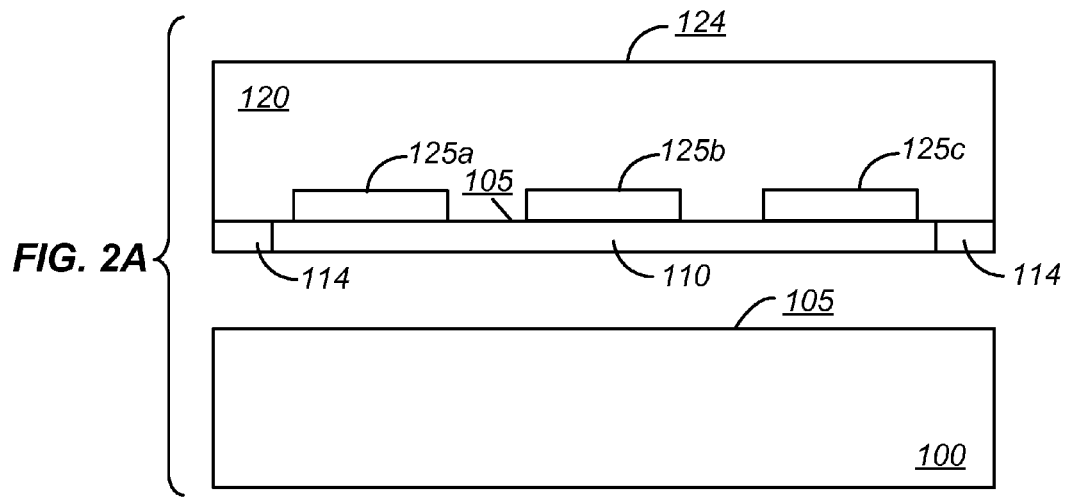
FIGS. 2A-2F are simplified schematic diagrams illustrating a second process flow according to an embodiment of the present invention.

FIGS. 2A-2F are simplified schematic diagrams illustrating a second process flow according to an embodiment of the present invention. The second process flow includes a wafer bonding, laser singulation, and die removal process provided by embodiments of the present invention. Referring to FIG. 2A, the semiconductor substrate 120 including the inert layer 110 and the annular ring 114 is positioned adjacent a carrier substrate 100 having a bonding surface 105. In an embodiment, the carrier substrate comprises a silicon substrate. In other embodiments, the carrier substrate includes a glass material to provide for transparency in the visible spectrum, useful during some optical alignment processes.

Figure 2B:
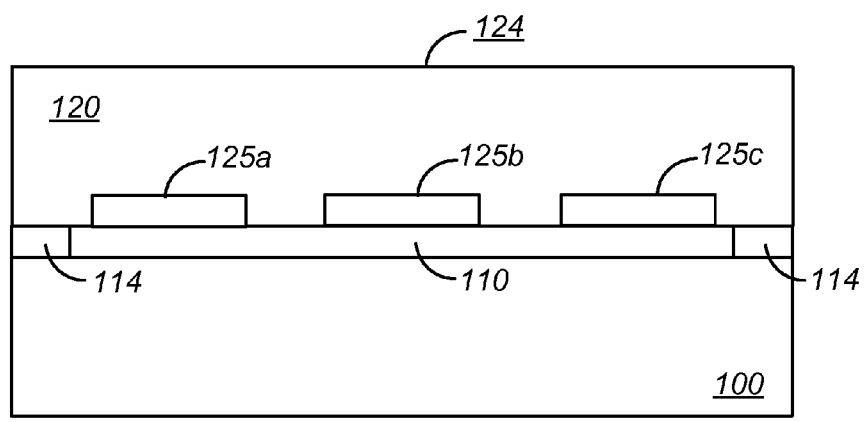

As illustrated in FIG. 2B, a wafer bonding process is performed to join the semiconductor substrate to the carrier substrate. The wafer bonding process can utilize one of several wafer bonding techniques. These techniques include low temperature bonding methods such as anodic, eutectic, fusion, covalent, glass frit, and/or other bonding techniques. In alternative embodiments, bonding of the two substrates is performed using a variety of techniques. In a specific embodiment, the bonding occurs using a room temperature covalent bonding process. Each of the bonding surfaces is cleaned and activated, for example, by plasma activation or by wet processing. The activated surfaces are brought in contact with each other to cause a sticking action. In some bonding processes, mechanical force is provided on each substrate structure to press the bonding surfaces together. In some embodiments, the bonding surfaces of one or more of the substrates is polished by a CMP process, providing an extremely smooth surface that is conducive to covalent bonding processes. Of course, one of ordinary skill in the art would recognize many other variations, modifications, and alternatives. In some embodiments, vent holes are provided (for example, in a radial direction) passing through the annular ring 114 to provide for outgassing to prevent bubble formation in the bonded structure.

Figure 2C:
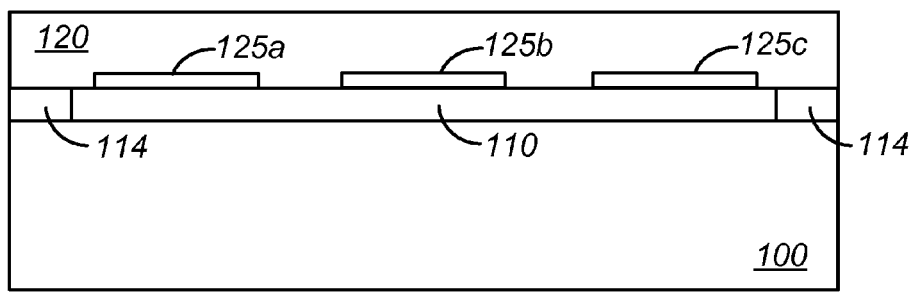

Referring to FIG. 2C, the backside 124 of the semiconductor substrate is thinned using one or more processing steps to reduce the thickness of this substrate. Such processing steps may include CMP, grinding, etch back, any combination of these, and the like. In some implementations, an etch stop layer is integrated into the semiconductor substrate to assist in termination of the thinning process. Plasma ashing and/or other cleaning processes can be performed as part of the thinning process. As illustrated in FIG. 2C, after thinning, the structure includes the carrier substrate 100, the inert layer 110 at central portions of the structure, annular adhesive layer 114, and the thinned semiconductor substrate 120 with devices 125a/b/c. Additional protective layers can be incorporated in addition to the illustrated layers are discussed throughout the present specification.

Figure 2D:
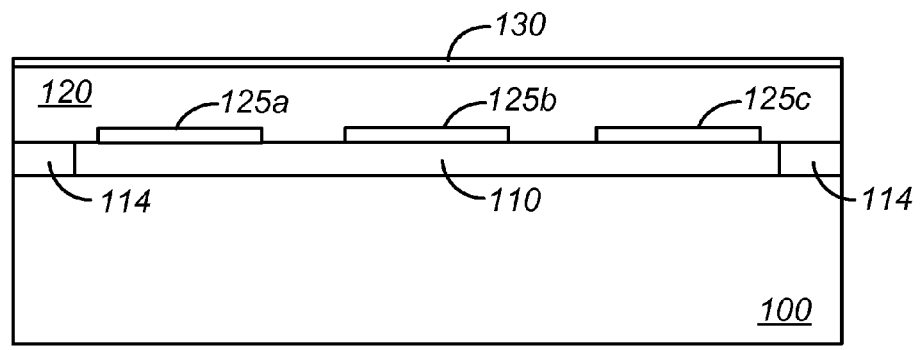

Embodiments of the present invention utilize a laser singulation process. As illustrated in FIG. 2D, a mask layer 130 is formed on a surface of the semiconductor substrate, for example, the surface opposing the device surface. The mask layer 130 can be a single layer or a multi-layer structure including one or more layers operable to protect the surface of the semiconductor substrate, which may have solder balls or other structures formed therein. In the illustrated embodiment, the laser mask is formed directly on the silicon surface, but this is not required by the present invention and other embodiments utilize a two-step mask layer, for example, a polyimide/oxide combination. Although thinning of the semiconductor substrate is illustrated as occurring prior to singulation, other embodiments perform thinning after singulation or combinations thereof.

A variety of suitable masking materials are utilized according to embodiments of the present invention including polyimide materials, photosensitive polymers, non-photosensitive polymers, photoresist, combinations thereof, or the like.

Figure 2E:
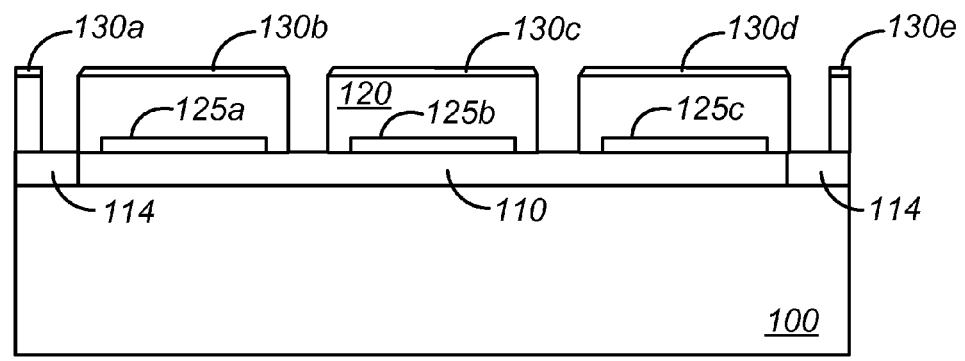

Backside alignment (i.e., alignment marks on the device surface of the semiconductor substrate are viewed through the thinned substrate) is used to align the etch mask with the devices 125a/b/c. Laser ablation is used to remove a predetermined portion of the mask layer as illustrated by the spaces between regions 130a, 130b, 130c, 130d, and 130e in FIG. 2E. Although a cross-section is illustrated in FIG. 2E, one of ordinary skill in the art will appreciate that a two-dimensional pattern extending into the plane of the figure will be formed in typical applications. The laser ablation of the mask layer results in the formation of an etch mask having a predetermined pattern. In the illustrated embodiment, the mask layer e.g., a polyimide and/or a thin protect layer) is used as the hard mask during a subsequent etching process as described below. Although a single layer is illustrated for mask layer 130, this is not required by the present invention and multiple layer stacks can be utilized including, for example, a polyimide, an oxide, resist, combinations thereof, or the like. Thus, one or more materials may provide for masking during laser ablation and other materials can provide for masking during etching.

Although laser ablation is utilized in some embodiments, other embodiments utilize a lithography process in conjunction with laser ablation or as a replacement for laser ablation. In an embodiment, no mask layer is utilized and a laser ablation process, which can be based on a Cartesian coordinate system, is used to perform the device singulation. In yet another embodiment, a mechanical separation process such as diamond sawing, is used to perform the device singulation. As will be evident to one of skill in the art, combinations of these techniques can be utilized. Thus, multiple techniques including laser ablation without use of a mask, laser patterning of a mask/laser ablation/etching process, or mechanical scribing/sawing are included within the scope of the present invention.

An etching process is then used to remove portions of the semiconductor substrate underlying the portions of the mask layer removed by laser ablation (i.e., a scribe etch process) as illustrated in FIG. 2E. The etching process can include a variety of material removal processing including dry etching, reactive ion etching, wet etching, or the like. The etching process results in singulation of the semiconductor dies. One benefit provided by the laser singulation process is a very small scribe street. Depending on the structures present on the device surface (e.g., metallization such as an interconnect layer), the etch can be supplemented with an additional laser ablation process to ablate a portion of the structures. Thus, the etch process may be a multi-step process involving multiple etching steps, laser ablation, combinations thereof, or the like. To provide protection for the sides of the dies, a liner can be applied to the trenches, for example, using a low temperature oxide film formation process. Metal sputtering and/or plating can then be performed as appropriate to the particular application.

Figure 2F:
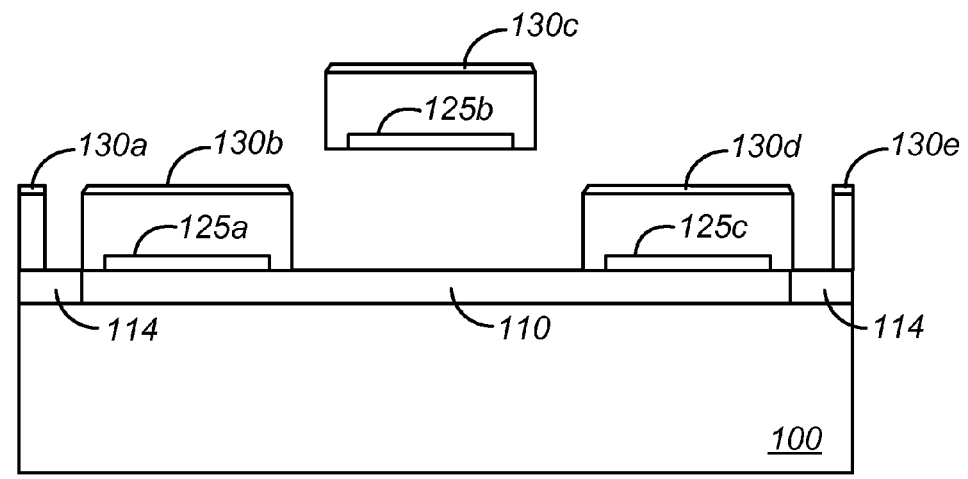

After singulation, the dies can be removed easily as illustrated in FIG. 2F, for example, using a vacuum-assisted pick and place tool in contact with the backside of the semiconductor substrate since the inert film has low adhesion to the device surface of the semiconductor substrate in comparison to the adhesive material. As illustrated in FIG. 2E, because adhesive material is only in contact with the semiconductor substrate at the peripheral regions free of devices structures, the adhesive material does not adhere the singulated dies to the carrier substrate. In some embodiments, the surface interaction between the device structures and the inert material (e.g., van der Waals forces) will provide sufficient adhesion to maintain the dies in their locations prior to removal. In other embodiments, a soft adhesion promoter is deposited on the semiconductor substrate prior to deposition of the inert layer 110 illustrated in FIG. 1A. In yet other embodiments, a low temperature thermal process is utilized to reduce any residual adhesion associated with the inert layer and to assist in the die removal process.

After singulation, the individual dies can be picked with a pick tool, for example, a vacuum pick tool and residue can be cleaned from the front side of the device wafer (e.g., with an oxygen plasma) using a suitable cleaning technique. After picking and/or cleaning, the die can be placed on another carrier, placed on tape, flipped onto another pick tool/tape, etc., or the like. Thus, embodiments of the present invention provide much greater flexibility than available using conventional techniques.

A variety of picking tools can be utilized including vacuum tools with an O-ring fixture, shoes with non-circular shapes suitable for the particular dies, or the like. A pixilated e-chuck can be used as a carrier on which the singulated die can be placed after picking, facilitating wafer-level cleaning processes. Additionally, one of several types of carriers, trays, a row of trays, or the like can be used to receive the individual die. Because the surface forces of the individual die are reduced in comparison to a thinned wafer, curling of the dies is typically not an issue, allowing a high level of flexibility in placement of the dies after the picking process. In some embodiments, the picking station is integrated with a die bonding tool. As another alternative, cleaning processes can be performed simultaneously on multiple die after picking and placement.

In some embodiments, depending on the particular devices present on the dies, a protection layer can be applied prior to application of the inert film. As an example, if the devices utilize copper pads with an aluminum layer supporting a silver-tin solder ball, these structures can be damaged in a post-picking plasma ashing cleaning process. In order to protect these structures, a protection film can be formed prior to formation of the inert layer 110 illustrated in FIG. 1A. After the inert film is cleaned, the protection layer can be removed using suitable cleaning processes appropriate for the protection layer. Exemplary protection layer include materials such as polymers, spun on materials, other films, combinations thereof, or the like. Thus, although a single layer of the inert film 110 is formed on the semiconductor substrate in the embodiment illustrated in FIG. 1A, the present invention is not limited to this single layer and multi-layer structures can be utilized as appropriate to the particular application. In some embodiments in which solder balls or other structures extend from the surface of the substrate, a compliance layer can be formed so that the solder balls or other structures can be surrounded on one or more sides by the compliance layer.

In some embodiments in which the inert material is characterized by greater adhesion, a thermal process can be used with a glass carrier substrate in which light in the visible spectrum (e.g., from a lamp) shines through the carrier wafer in a predetermined pattern to locally heat the inert material and thereby facilitate die removal. Thus, some embodiments can utilize an adhesive layer covering the entirety of the semiconductor substrate and dispense with the use of an inert film. In other embodiments, this concept is modified to utilize substrates that are substantially transparent at other wavelengths matched with sources at these other wavelengths (e.g., silicon substrates and infrared light). In these embodiments, the adhesive material is engineered to absorb at the appropriate wavelength while the device features are non-absorbing at this appropriate wavelength. Thus, the adhesive material can be thermally treated to reduce adhesion while solder balls do not reflow. One of ordinary skill in the art would recognize many variations, modifications, and alternatives.

Figure 3:
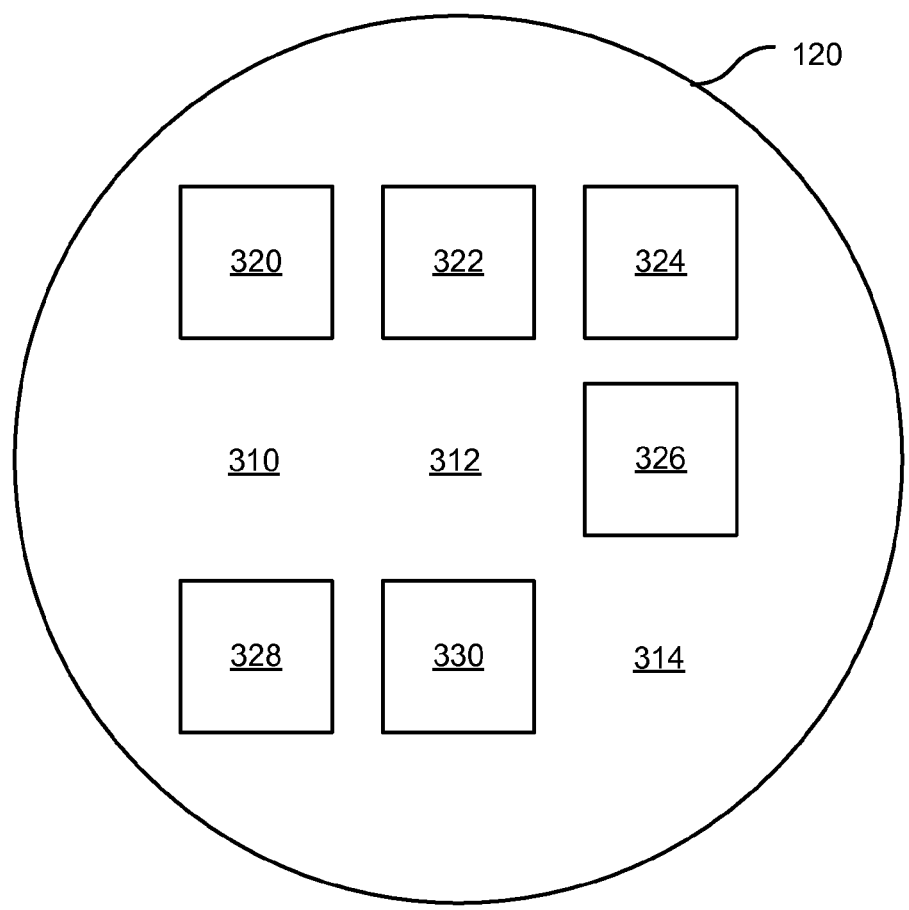
FIG. 3 is a plan view of a semiconductor substrate during singulation according to an embodiment of the present invention.

FIG. 3 is a plan view of a semiconductor substrate 120 during singulation according to an embodiment of the present invention. As illustrated in FIG. 3, several dies that were positioned at positions 310, 312, and 314 have been singulated and removed with several dies 320-330 still attached to the semiconductor substrate 120.

Figure 4:
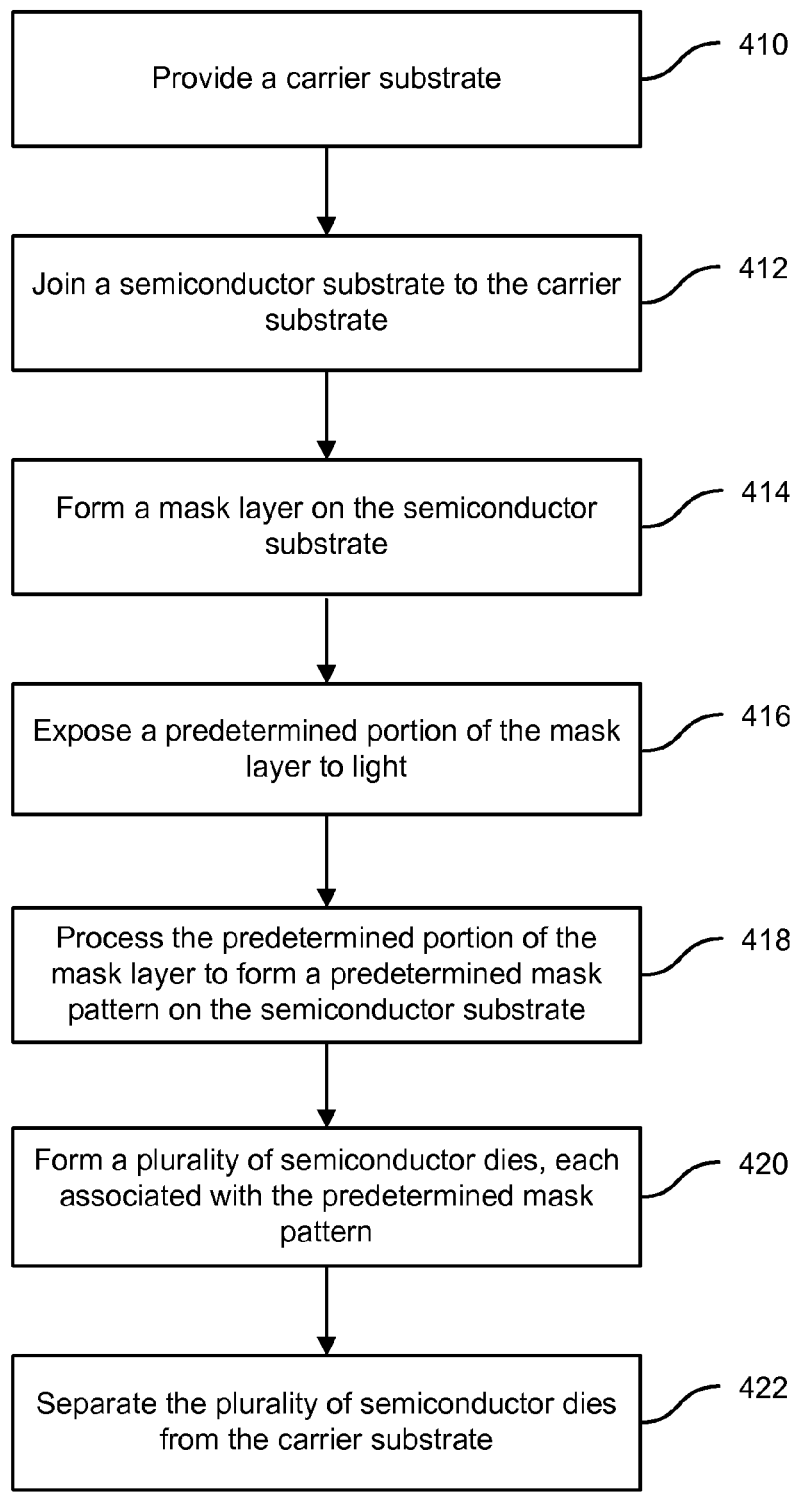
FIG. 4 is a simplified flowchart illustrating a method of singulating a plurality of semiconductor dies according to an embodiment of the present invention.

FIG. 4 is a simplified flowchart illustrating a method of singulating a plurality of semiconductor dies according to an embodiment of the present invention. The method 400 includes providing a carrier substrate (410) and joining a semiconductor substrate to the carrier substrate (412). The semiconductor substrate includes a plurality of devices. In an embodiment, the carrier substrate comprises a silicon substrate although other substrates, including glass substrates can be utilized. As described above, joining the semiconductor substrate to the carrier substrate, in some embodiments, includes forming a film on the semiconductor substrate, for example an inert film (e.g., an amorphous carbon film) that is substantially unreactive with devices on the semiconductor substrate. In an embodiment, the edge portion of the film is removed and an adhesive layer coupled to the semiconductor substrate is formed. As an example, the adhesive layer can be formed as an annular layer surrounding the film. The carrier substrate, the film, and the adhesive layer are brought into contact to bond the two substrates together. The film can be a single layer of a single material or be a composite structure including multiple materials including adhesion promoters, protection layers, and the like.

In an embodiment, a photosensitive material is used as a combination adhesive/inert material. As an example, a material that becomes adhesive upon exposure to light can be applied and the peripheral or other portions of the material can be exposed, creating an adhesive ring or pattern in the material. Unexposed material will be characterized by low adhesiveness, providing the function associated with the inert material descried herein. In an alternative embodiment, a complementary material is used in which exposure leads to a reduction in the adhesiveness of the material and lack of exposure is associated with adhesiveness. One of ordinary skill in the art would recognize many variations, modifications, and alternatives. In addition to annular structures, these photosensitive materials could be exposed using a Cartesian coordinate system to result in adhesive material being provided in association with one or more die, for example, die that have been screened and determined to be unusable.

In an alternative embodiment, joining the semiconductor substrate to the carrier substrate includes forming an inert film on the semiconductor substrate and removing a portion of the inert film associated with a predetermined pattern associated with one or more of the plurality of devices. As an example, if some testing of the dies has been performed and it is determined that a particular die is not fully functional, the adhesive can be applied adjacent the non-functional die, preventing it from being separated during later processing.

The method also includes forming a mask layer on the semiconductor substrate (414), exposing a predetermined portion of the mask layer to light (416), and processing the predetermined portion of the mask layer to form a predetermined mask pattern on the semiconductor substrate (418). As an example, forming the predetermined mask pattern can include developing the predetermined portion of the mask layer and etching the predetermined portion of the mask layer to expose a surface of the semiconductor substrate. As illustrated in FIG. 2E, portions of the semiconductor substrate under the open areas of the mask layer can be etched all the way through the semiconductor substrate to reach the film/adhesive layer or the carrier substrate.

The method further includes forming the plurality of semiconductor dies (420) and separating the plurality of semiconductor dies from the carrier substrate (422). Each of the plurality of semiconductor dies is associated with the predetermined mask pattern and includes one or more of the plurality of devices. In some embodiments, the plurality of semiconductor dies can be cleaned using one of various processes after die separation. The picking of the die from the carrier substrate can be performed one at a time or using an apparatus that can pick multiple die simultaneously (gang separation). In some embodiments in which multiple die are picked simultaneously, the vacuum for the various picking elements can be independently controlled to not pick the die that have been determined to be unusable or for other reasons. As an example, the die separation tool can be programmed to pick predetermined die and leave the remaining die attached to the carrier substrate.

It should be appreciated that the specific steps illustrated in FIG. 4 provide a particular method of singulating a plurality of semiconductor dies according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
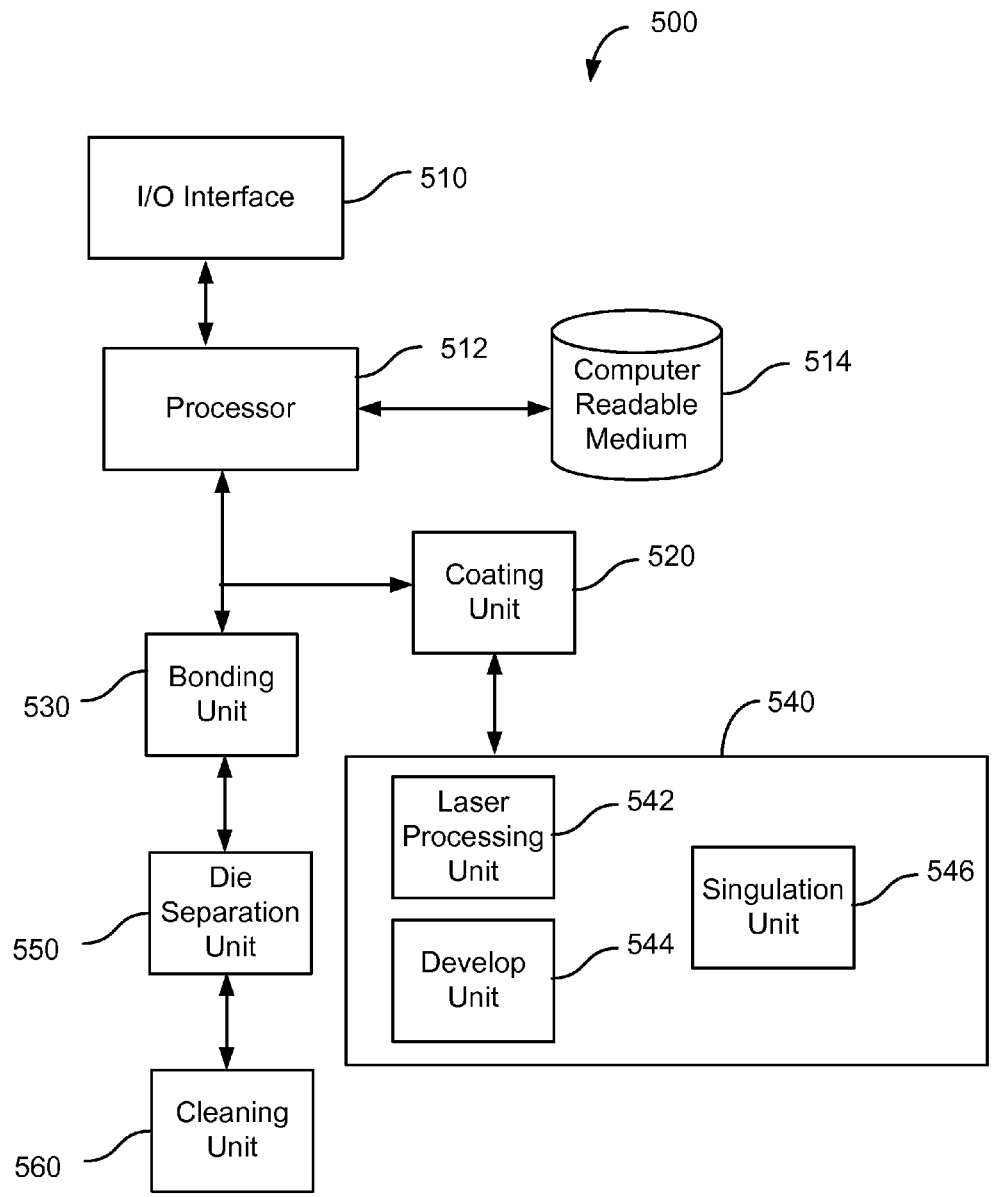
FIG. 5 is a simplified schematic diagram of a system for singulating a plurality of semiconductor dies according to an embodiment of the present invention.

FIG. 5 is a simplified schematic diagram of a system for singulating a plurality of semiconductor dies according to an embodiment of the present invention. The system 500 includes control devices, for example, an input/output interface 510, a processor 512 (also referred to as a data processor), and a computer readable medium 514 such as memory. The processor 512 and the memory 514 interact with the I/O interface to provide for user control of the various units described herein. The processor 512 represents a central processing unit of any type of architecture, such as a CISC (Complex Instruction Set Computing), RISC (Reduced Instruction Set Computing), VLIW (Very Long Instruction Word), or a hybrid architecture, although any appropriate processor may be used. The processor 512 executes instructions and includes that portion of a computer that controls the operation of the entire computer. Although not depicted in FIG. 5, the processor 512 typically includes a control unit that organizes data and program storage in memory and transfers data and other information between the various parts of the computer. The processor 512 receives input data from the I/O interface 510 and/or a network (not shown) and reads and stores code and data in the computer readable medium 514 and presents data to the I/O interface 510. Although a single processor is illustrated in FIG. 5, the disclosed embodiment applies equally to computers that may have multiple processors and to computers that may have multiple busses with some or all performing different functions in different ways.

The computer readable medium 514 represents one or more mechanisms for storing data. For example, the computer readable medium 514 may include read-only memory (ROM), random access memory (RAM), magnetic disk storage media, optical storage media, flash memory devices, and/or other machine-readable media. In other embodiments, any appropriate type of storage device may be used. Although only one computer readable medium 514 is shown, multiple computer readable media and multiple types of storage devices may be present. Further, although the computer readable medium 514 is illustrated as connected to the processor 512, it may be distributed across other computers, for example on a server.

The computer readable medium 514 includes a controller (not shown in FIG. 5) and data items. The controller includes instructions capable of being executed on the processor 512 to carry out the methods described more fully throughout the present specification. In another embodiment, some or all of the functions are carried out via hardware in lieu of a processor-based system. In one embodiment, the controller is a web browser, but in other embodiments the controller may be a database system, a file system, an electronic mail system, a media manager, an image manager, or may include any other functions capable of accessing data items. Of course, the computer readable medium 514 may also contain additional software and data (not shown), which is not necessary to understand the invention.

The system further includes a coating unit 520 operable to form a mask layer on a semiconductor substrate including a plurality of devices and a bonding unit 530 operable to join the semiconductor substrate to a carrier substrate. The coating unit can be used to form the various coating layers described herein. A processing and development unit 540 includes one or more sub-units, including a laser processing unit 542 operable to expose a predetermined portion of the mask layer to laser light, a development processing unit 544 operable to form a predetermined mask pattern on the semiconductor substrate, and a singulation unit 546 operable to form the plurality of semiconductor dies. The singulation unit 546 can include a development unit and an etching unit. Although these sub-units are illustrated as combined in the processing and development unit 540 in the embodiment illustrated in FIG. 5, this is not required by the present invention and these sub-units may be stand alone units. The laser processing unit 542 can include a laser source or be optical coupled to an external laser source, for example, through a fiber optic cable.

According to some embodiments, a die separation unit 550 and a cleaning unit 560 are included in system 500. The die separation unit 550 is operable to separate the plurality of semiconductor dies from the carrier substrate.

Figure 6:
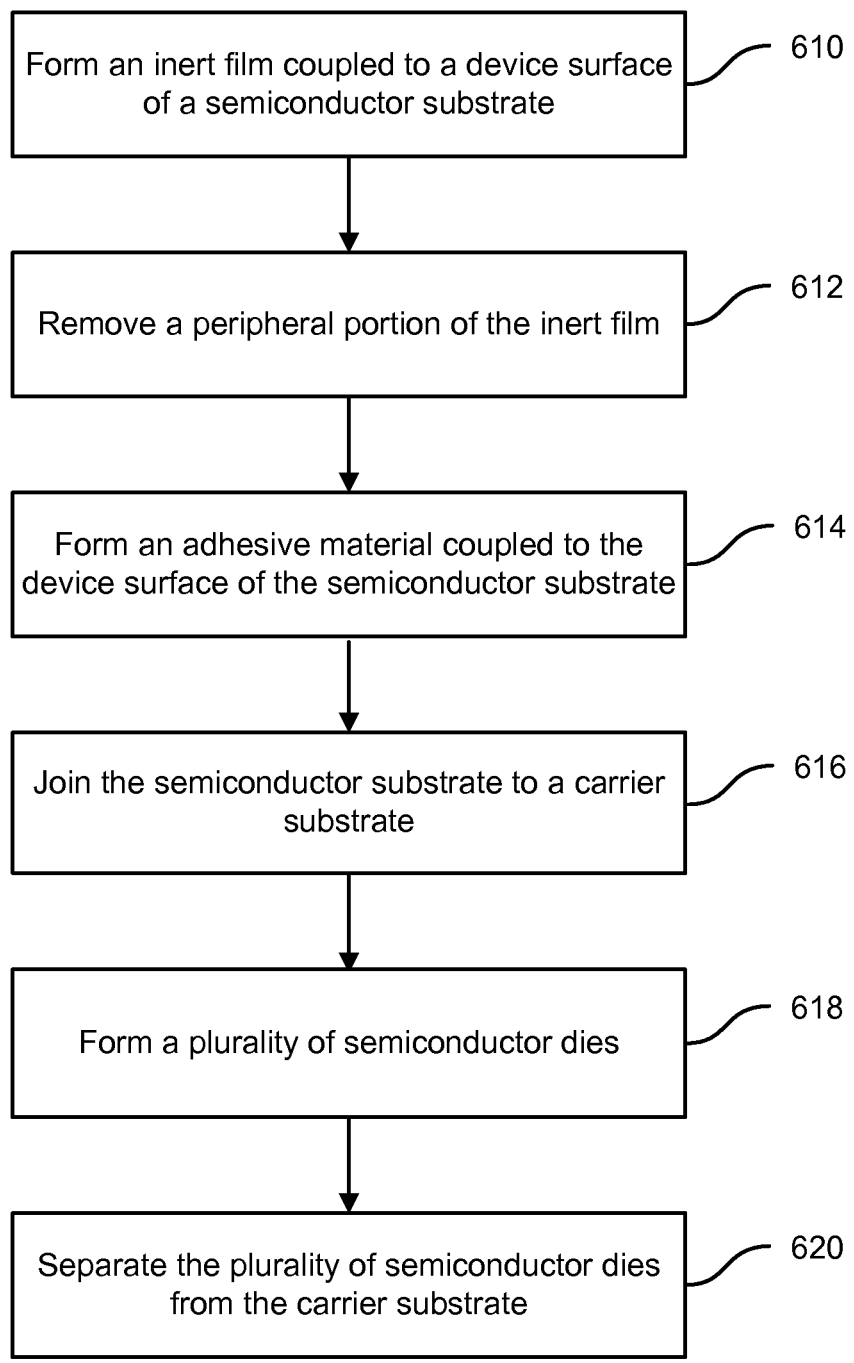
FIG. 6 is a simplified flowchart illustrating a method of singulating a plurality of semiconductor dies according to another embodiment of the present invention.

FIG. 6 is a simplified flowchart illustrating a method of singulating a plurality of semiconductor dies according to another embodiment of the present invention. Referring to FIG. 6, the method includes providing a semiconductor substrate having a plurality of devices formed thereon and forming an inert material coupled to the device surface of the semiconductor substrate (610). The inert material may be formed in contact with an adhesion layer formed on the semiconductor substrate. In some embodiments, the inert film covers the entire semiconductor substrate, whereas in other embodiments, portions of the semiconductor substrate are free of the inert film. As discussed above, the inert material can be a variety of materials that provide a film that is compatible with low temperature processing and substantially unreactive with respect to the devices formed on the semiconductor substrate. Merely by way of example, the inert film, which can be a multilayer composite structure, can be an APF deposited by PECVD, although the inert films are not limited to this example.

The method also includes removing a peripheral portion of the inert film (612), which, in some embodiments, exposes a peripheral portion of the semiconductor substrate. In some embodiments, the inert film is completely removed in the peripheral region, whereas in other embodiments, part of the inert film remains coupled to the semiconductor substrate in the peripheral region. One of ordinary skill in the art would recognize many variations, modifications, and alternatives. As discussed above, an EBR process can be used to remove the peripheral portion of the inert film.

The method further includes forming an adhesive material coupled to the device surface of the semiconductor substrate (614). The adhesive material can be applied directly to the exposed semiconductor substrate in the peripheral region, applied to an adhesion promoting layer, or the like. In some embodiments, an upper surface of the adhesive material is coplanar with an upper surface of the inert material, providing a high quality wafer bonding surface for subsequent wafer bonding processes.

A substrate or wafer bonding process is used to join the semiconductor substrate to a carrier substrate (616). As illustrated in FIGS. 2A/2B, the inert material/adhesion material layer can be bonded to a bonding surface of the carrier substrate, forming a compound semiconductor structure. In some embodiments, a portion of the semiconductor substrate (the backside of the substrate) is removed using a wafer thinning process such as CMP to reduce the thickness of the semiconductor substrate as appropriate for device operation. In some embodiments using a mask-based singulation process, a mask layer is formed and processed (e.g., on the surface of the semiconductor substrate opposing the device surface) to form a predetermined mask pattern on the semiconductor substrate, for example, by exposing a predetermined portion of the mask layer to light. In these mask-based singulation embodiments, the method includes processing the predetermined portion of the mask layer to form a predetermined mask pattern on the semiconductor substrate. As an example, forming the predetermined mask pattern can include developing the predetermined portion of the mask layer and etching the predetermined portion of the mask layer to expose a surface of the semiconductor substrate. As illustrated in FIG. 2E, portions of the semiconductor substrate under the open areas of the mask layer can be etched all the way through the semiconductor substrate to reach the film/adhesive layer or the carrier substrate.

Referring to FIG. 6, the method additionally includes forming a plurality of semiconductor dies (618) and separating the plurality of semiconductor dies from the carrier substrate (620). According to some embodiments, a laser singulation method is utilized to singulate the dies as described above. Each of the plurality of semiconductor dies typically includes one or more of the plurality of devices. In some embodiments, the plurality of semiconductor dies can be cleaned using one of various processes after die separation. The picking of the die from the carrier substrate can be performed one at a time or using an apparatus that can pick multiple die simultaneously (gang separation). In some embodiments in which multiple die are picked simultaneously, the vacuum for the various picking elements can be independently controlled to not pick the die that have been determined to be unusable or for other reasons. As an example, the die separation tool can be programmed to pick predetermined die and leave the remaining die attached to the carrier substrate.

It should be appreciated that the specific steps illustrated in FIG. 6 provide a particular method of singulating a plurality of semiconductor dies according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of singulating a plurality of semiconductor dies, the method comprising:
   providing a carrier substrate;
   forming a film on a semiconductor substrate including a plurality of devices;
   removing a portion of the film to expose predetermined portions of the semiconductor substrate, the predetermined portions including an edge portion and one or more central portions associated with defective devices;
   coating the predetermined portions with an adhesive material coupled to the semiconductor substrate; and
   joining the semiconductor substrate to the carrier substrate;
   forming a mask layer on the semiconductor substrate;
   exposing a predetermined portion of the mask layer to light;
   processing the predetermined portion of the mask layer to form a predetermined mask pattern on the semiconductor substrate;
   forming the plurality of semiconductor dies, each of the plurality of semiconductor dies being associated with the predetermined mask pattern and including one or more of the plurality of devices; and
   separating the plurality of semiconductor dies from the carrier substrate.

2. The method of claim 1 wherein the carrier substrate comprises a silicon substrate.

3. The method of claim 1 wherein joining the semiconductor substrate to the carrier substrate comprises:
   making contact between the carrier substrate, the film, and the adhesive material disposed on the predetermined portions.

4. The method of claim 3 wherein the adhesive layer comprises an annular layer surrounding the film.

5. The method of claim 3 wherein the film comprises an inert material.

6. The method of claim 5 wherein the inert material comprises an amorphous carbon material.

7. The method of claim 1 wherein forming the predetermined mask pattern comprises:
   directing a laser beam to impinge on the predetermined portion of the mask layer; and
   etching the predetermined portion of the mask layer to expose a surface of the semiconductor substrate.

8. The method of claim 7 wherein forming the plurality of semiconductor dies comprises etching at least a portion of the semiconductor substrate to form the plurality of semiconductor dies.

9. The method of claim 1 further comprising cleaning the plurality of semiconductor dies.

* * * * *